United States Patent [19]

Greer

[11] Patent Number: 5,010,270

[45] Date of Patent: Apr. 23, 1991

[54] SAW DEVICE

[75] Inventor: James A. Greer, Andover, Mass.

[73] Assignee: Raytheon Company, Lexington, Mass.

[21] Appl. No.: 442,404

[22] Filed: Nov. 28, 1989

Related U.S. Application Data

[63] Continuation of Ser. No. 293,607, Jan. 5, 1989, abandoned, which is a continuation of Ser. No. 153,186, Mar. 8, 1988, abandoned, which is a continuation of Ser. No. 944,911, Dec. 22, 1986, abandoned.

[51] Int. Cl.$^5$ .................................. H01L 41/08
[52] U.S. Cl. ........................... 310/313 D; 310/313 R; 310/344; 310/364; 29/25.35; 333/153; 324/723
[58] Field of Search ............... 310/312, 313 R, 313 B, 310/313 D, 344, 364; 333/150, 152, 153, 193, 195, 196; 29/25.35, 593; 219/121 LM, 121 LH, 121 LJ; 324/56; 427/53.1, 53.4, 100, 10, 44; 204/192.2, 192.32, 192.32

[56] References Cited

U.S. PATENT DOCUMENTS

| | | | |
|---|---|---|---|
| 3,006,711 | 10/1961 | Silver | 310/312 |
| 3,969,640 | 7/1976 | Staudte | 310/312 |
| 4,021,898 | 5/1977 | Willis | 310/312 X |
| 4,055,820 | 10/1977 | Solie | 310/313 D |
| 4,097,825 | 6/1978 | Gerard | 310/313 D X |
| 4,107,349 | 8/1978 | Vig | 310/348 X |
| 4,204,178 | 5/1980 | Mitchell | 310/313 D X |
| 4,213,104 | 7/1980 | Cullen et al. | 310/313 R X |
| 4,217,564 | 8/1980 | Autran | 333/152 |
| 4,243,960 | 1/1981 | White et al. | 333/196 |
| 4,270,105 | 5/1981 | Parker et al. | 333/155 |
| 4,296,347 | 10/1981 | Weirauch | 310/313 R X |
| 4,330,768 | 5/1982 | Huang et al. | 333/153 |
| 4,345,176 | 8/1982 | Grudkowski et al. | 310/313 D X |
| 4,364,016 | 12/1982 | Tanski | 333/193 |
| 4,400,640 | 8/1983 | Cho et al. | 310/313 A |
| 4,409,570 | 10/1983 | Tanski | 333/195 X |
| 4,435,441 | 3/1984 | Mariani et al. | 427/10 |
| 4,442,574 | 4/1984 | Wanuga et al. | 29/25.35 |
| 4,468,582 | 8/1984 | Fujiwara et al. | 310/364 X |
| 4,472,652 | 9/1984 | Brice et al. | 310/364 X |
| 4,504,758 | 3/1985 | Wisbey | 310/313 R |
| 4,598,224 | 7/1986 | Ballato | 310/313 R |
| 4,610,894 | 9/1986 | Setsune et al. | 427/53.1 |

OTHER PUBLICATIONS

"Metal Deposition from a Supported Metal Film Using an Excimer Laser" by J. Bohandy et al., J. Appl. Phys. 60 (4), 15 Aug. 1986, pp. 1538-1539.

Primary Examiner—Mark O. Budd
Attorney, Agent, or Firm—Denis G. Maloney; Richard M. Sharkansky

[57] ABSTRACT

Techniques for adjusting the surface acoustic wave velocity of a packaged SAW device are described. A first technique involves depositing a film from a cover of the device onto a surface wave propagating surface thereby providing a localized region on said surface where the acoustic properties and, hence, the velocity characteristics of the surface wave propagating surface are altered. An alternate embodiment of a pair of beams are directed through a transparent cover and converge on the surface wave propagating surface, selectively removing a portion of said surface to provide a localized alteration in the acoustic properties of the surface wave propagating surface.

20 Claims, 3 Drawing Sheets

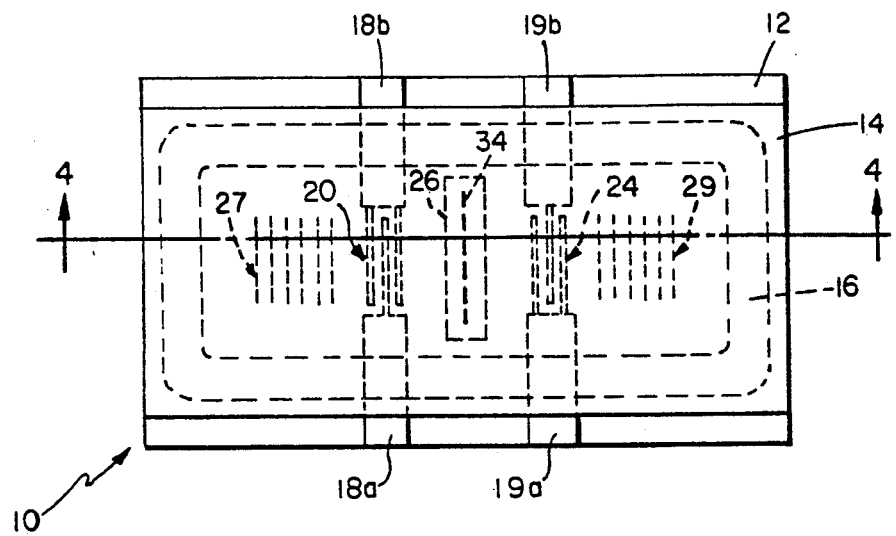
FIG. 3
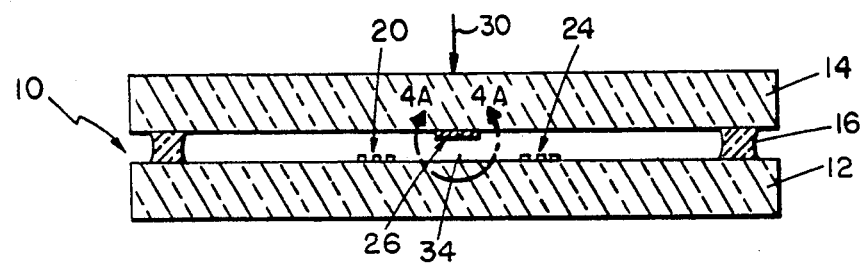
FIG. 4
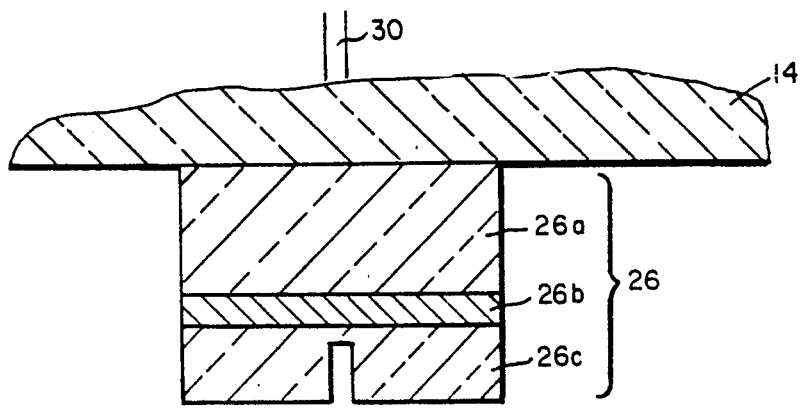
FIG. 4A
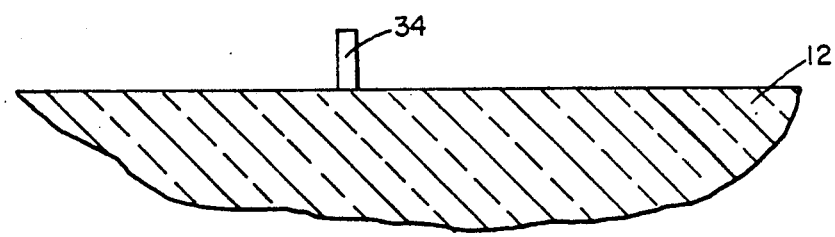

SAW DEVICE

This application is a combination of application-in-part of application Ser. No. 293,607 filed Jan. 5, 1989 (now abandoned) which is a combination of Ser. No. 153,186 filed Feb. 8, 1988 abandoned which is a continuation of Ser. No. 944,911 filed Dec. 22, 1986 abandoned.

BACKGROUND OF THE INVENTION

This invention relates generally to surface acoustic wave devices and more particularly to adjusting the frequency characteristics of a surface acoustic wave device.

As it is known in the art, surface acoustic wave devices such as resonators, delay lines, filters and pressure transducers are used in a variety of applications. Generally, a SAW device comprises at least one transducer, having a set of conductive members, which is disposed on or recessed within an upper surface portion of a piezoelectric substrate.

A new type of package has been developed which hermeticaly seals the SAW device substrate. This new package includes a pair of piezoelectric substrates which are sealed together by a glass frit, such as described in conjunction with a paper entitled "Saw Resonator Frit Bonded Pressure Transducer" by D. Weirauch et al, Proceedings of the IEEE Ultrasonic Symposium, 1979, p. 874, and an article entitled "Long Term Aging, A Mechanical Stability of 1.4 GHz SAW Oscillators" by M. Gilden et al, Proceedings of the IEEE Ultrasonic Symposium, 1980, p. 184, a second type of package is shown in U.S. Pat. No. 4,270,107, Parker et al issued May 26, 1981 entitled "Stabilized Surface Wave Device" and assigned to the same assignee as the present invention.

Although these packages provide improved packaging and handling capabilities for SAW devices, one problem associated with these packages is that during the fabrication of the package, the frequency characteristics of the package SAW device are changed from that of the prepackaged SAW device. For example, for SAW resonators operating around 350 MHz, this frequency shift may average approximately 45 ppm and may have a standard deviation as high as ±15 ppm. For other types of devices and devices which are designed to operate at higher frequencies, both the magnitude and standard deviation of this shift increase making accurate setting of the frequency characteristics of the SAW device more difficult. In many applications, accurate frequency settability of ±1 ppm would be desirable.

One solution to this problem has been to use external electrical components to adjust the frequency characteristics of the circuits employing the SAW device. The problem with this approach is that this type of external frequency adjustment is very time consuming, relatively expensive since the number of components required in any particular SAW device application is increased, and furthermore, the components themselves may contribute to frequency changes in circuits employing such SAW devices.

SUMMARY OF THE INVENTION

In accordance with the present invention, a method of changing the surface wave velocity characteristic of a surface which supports surface wave propagation is provided by directing energy through a first one of a base and cover, which enclose said surface, towards a first material disposed over said surface, to provide a layer of a second material on said surface to change the velocity characteristic of said surface. With this particular arrangement, the layer of second material on the base provides a small, localized change in the surface wave velocity characteristic of the surface which supports surface wave propagation, thus permitting adjustment in the frequency characteristics of packaged SAW devices.

In accordance with a further aspect of the present invention, a method of changing the surface wave velocity of a packaged surface acoustic wave device is provided by directing incident energy through a cover of the packaged device to remove a portion of a layer of material disposed over a surface wave propagation surface of the SAW device. With this particular arrangement, the removed material provides a small, localized change in the acoustic properties of the surface wave propagation surface, thus providing a concomitant change in the frequency characteristics of the SAW device.

In accordance with a further aspect of the present invention, a method of changing the surface wave velocity of a packaged surface acoustic device includes the steps of: providing a cover over the surface wave device forming an enclosure over said surface wave device with at least one of said cover and base being comprised of a material which is substantially transparent to energy over a selective wavelength range. A layer of material is disposed on an inner surface portion of the cover. Energy is directed towards this layer of material through the transparent cover or base, to remove selected portions of the material from the layer, and have said selected removed portions redeposit onto the surface wave propagating surface. With this particular arrangement, the surface wave velocity characteristic and hence, the frequency characteristics of a packaged SAW device may be adjusted after the SAW device is packaged. The redeposited material produces a small, localized alteration in the acoustic properties of the piezoelectric surface which changes the surface wave velocity of propagating surface waves. Therefore, this change in surface wave velocity provides an accompanying change in frequency characteristics of the SAW device.

In accordance with a still further aspect of the present invention, the cover portion of the material is quartz, and the quartz is transparent to light energy from a laser having a wavelength in the range of about 0.185 $\mu$m to 4 $\mu$m. Disposed on the inner portion of the quartz cover is a pad, comprising a first layer of a thermally buffering material, a second layer of an energy conversion material, and a third layer of an ablatable or evaporatable material. The incident optical energy is directed towards this pad. The quartz cover and the first layer comprising the thermally buffering material are substantially transparent to the incident optical energy. The incident energy, however, heats up the intermediate energy conversion layer disposed between thermally buffering layer and the ablatable layer. The heat generated in the energy conversion layer causes the ablatable or evaporatable layer to ablate or to evaporate and redeposit onto underlying portions of the piezoelectric surface. The first dielectric layer is provided to buffer the quartz cover from the heat associated with the energy conversion layer. With this particular arrangement, the frequency characteristics of a SAW may be adjusted by the use of a laser, which selectively redeposits a predetermined portion of the ablatable or evaporatable layer over the surface wave propagating surface of the SAW device, adjusting the surface wave velocity characteristic and, hence, the frequency characteristics of the SAW device.

In accordance with a still further aspect of the present invention, a method of changing the surface wave velocity characteristic of a packaged SAW device includes the steps of providing a cover comprised of a material which is transparent to electromagnetic energy over a selected wavelength range, with the cover being disposed to enclose a surface wave propagating surface. A highly convergent beam or a pair of beams, each at a selected incident angle to converge on said surface, is directed towards said surface to produce a beam of sufficient intensity to selectively remove portions of said propagating surface. With this particular arrangement, by selectively removing portions of the piezoelectric propagating surface, a small, localized alteration in the acoustic properties and, hence, surface wave velocity characteristic is provided. Accordingly, the frequency characteristics of said SAW device also will be altered.

BRIEF DESCRIPTION OF THE DRAWINGS

The foregoing features of this invention, as well as the invention itself, may be more fully understood from the following detailed description of the drawings, in which:

FIG. 3 is a plan view of a packaged SAW resonator after frequency trimming in accordance with the present invention;

FIG. 4 is a cross-sectional view taking along lines 4—4 of FIG. 3;

FIG. 4A is a blown-up view of a portion of FIG. 4 taking along line 4A—4A of FIG. 4;

FIG. 4B is a cross-sectional view showing a further aspect of the present invention;

DESCRIPTION OF THE PREFERRED EMBODIMENTS

Figure 1:
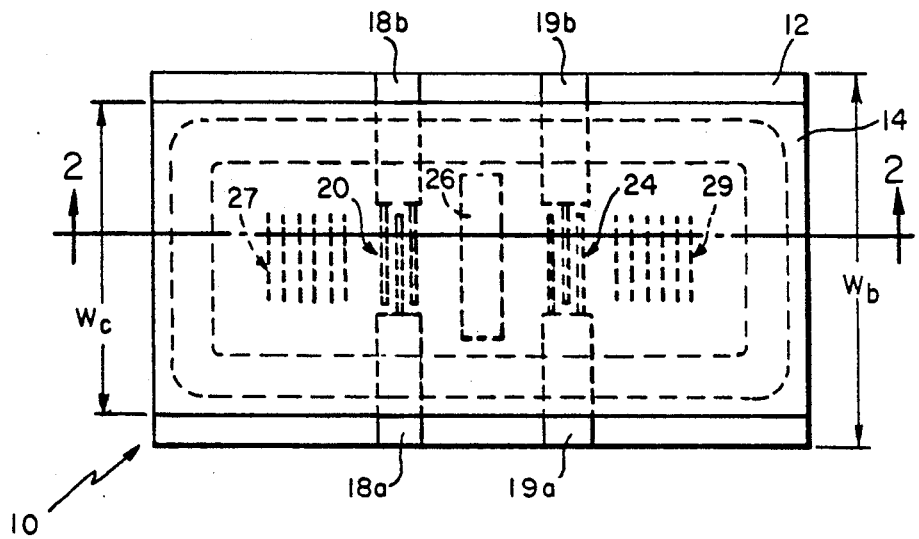
FIG. 1 is a plan view of a packaged SAW resonator prior to frequency trimming in accordance with the present invention.
Figure 2:
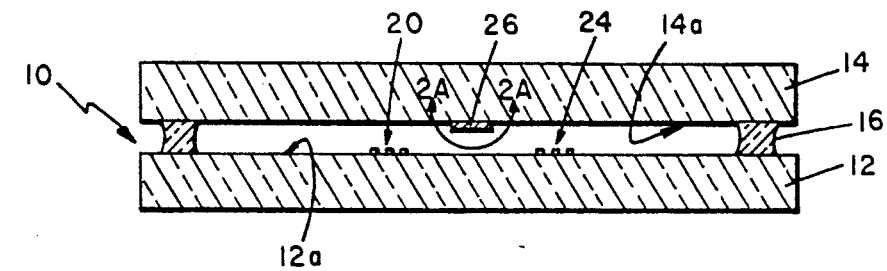
FIG. 2 is a cross-sectional view taking along line 2—2 of FIG. 1.
Figure 2A:
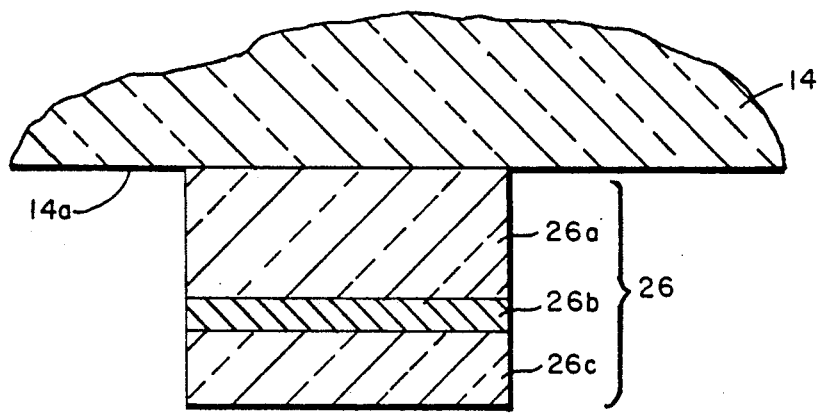
FIG. 2A is a blown-up view taking along line 2—2 of FIG. 2.

Referring now to FIGS. 1, 2, and 2A a packaged SAW device here a resonator 10 includes a base 12 having a surface 12a which supports surface wave propagation, a cover 14, and a glass frit seal 16 as shown. Base 12 is here comprised of ST-cut or rotated ST-cut quartz, having disposed on surface 12a thereof, a pair of interdigitated transducers 20 and 24 (IDT) and reflective gratings 27, 29. Interdigitated transducers 20 and 24 are coupled to busbars 18a and 18b, and 19a and 19b respectively, as shown. Disposed over the base 12 is the cover 14 here also comprised of ST-cut or rotated ST-cut quartz. Quartz is typically 85% to 95% transparent to energy having wavelengths in the range of about 0.185 $\mu$m to 4.0 $\mu$m, for samples 1–3 mm thick. Alternatively, base 12 and cover 14 may be comprised of other transparent materials such as lithium niobate. The base 12 and the cover 14 are sealed together using a suitable glass frit seal 16. The cover 14 has a width $w_c$ less than the width $w_b$ of the base 14 such that when the cover is sealed to the base, busbars 18a and 18b, and 19a and 19b are exposed on a peripheral portion of the base thereof, to provide electrical contact to external components.

As shown in particular in FIG. 2A, the inner surface 14a of cover 14 has disposed over a portion thereover, a layer here preferably a composite layer 26 comprised of a thermally buffering or shock absorbing layer 26a, a thermally absorbing or energy conversion layer 26b, and a thermally evaporating or ablating layer 26c. In this preferred arrangement, the thermally shock absorbing layer 26a comprises a dielectric material which is substantially transparent to the incident energy, which will be directed through the cover 14 of the SAW device in a manner to be described, but which provides sufficiently thermal resistance to thermally buffer the cover 14 from the heat generated in the thermally absorbing layer 26b as will be described. Energy conversion layer 26b is a material which substantially absorbs the incident energy directed through the cover 14 and the thermal shock layer 26a, and converts said incident directed energy into radiant energy or heat. The thermally ablating or evaporation layer 26c is disposed over the conversion layer 26b and absorbs some of the radiant energy generated in layer 26b, and if the energy therein is of sufficient intensity, the film 26c will be selectively removed, in particular, ablated or evaporated off the cover and will redeposit or condense onto the surface 12a, as shown in FIG. 4. The amount of this redeposited mass is selected to sufficiently alter the surface wave velocity characteristic of the SAW device, and thus, change the frequency characteristics of the SAW device, as required.

Referring now to FIGS. 3, 4, and 4A, incident energy 30 is shown directed through cover 14 towards the trim pad 26. The incident energy passes through transparent buffer layer 26a and is absorbed by selected underlying portions of energy conversion layer 26b. Layer 26b converts the directed energy to heat. The heat in layer 26b causes the ablation or evaporation of portions of layer 26c as shown. In accordance with the pulse width, power level, wavelength, and repetition rate of said energy, the layer 26c is either evaporated off at low energy levels or ablated off at higher energy levels. Moreover, at sufficiently high levels, selected portions of each of the layers 26a–26c may be removed. The removed material whether ablated or evaporated condenses and redeposits as a layer 34 across the base portion 12 of the SAW device 10. The presence of layer 34 on surface 12a of base 12 reduces the surface wave velocity of the wave in this region due to mass loading effects, as the surface wave propagates. By increasing the number of these layers 34 and their width and total mass, the range of adjustment of the surface wave velocity characteristic is increased.

Specific examples of devices fabricated in accordance with the teachings of the present invention will now be described. As shown in FIGS. 3, 4, and 4A, incident energy here in the form of light beams, from laser sources as set forth in Table, are formed having lengths which substantially traverse the length of the acoustic wave propagating surface and have widths which are generally on the order of the SAW wavelength (typically in the range of 2.5 μm to 50 μm. That is, a long narrow line across the length of the acoustic propagating surface and centered within and parallel to the acoustic aperture of the interdigitated transducer elements is directed towards the quartz cover. This energy passes through the quartz cover 14 and is absorbed by the composite trim pad 26, disposed on the inner surface 14a of the cover 14. With this laser beam pattern, the aluminum layer 26b is selectively heated in regions thereof, impinged by the incident laser beam. In response to this localized heating of the aluminum layer, portions of the aluminum oxide layer 26c are evaporated or ablated off the aluminum layer 26b and are redeposited onto the underlying surface wave propagating surface 12a. In particular, since the amount of frequency adjustment is related to the mass of the redeposited material on the surface wave propagating surface, the amount of frequency adjustment per line of the laser may be controlled by controlling the width and energy density of the laser beam, as well as the amount of material provided on the inner portion of the cover 14. It is believed that the maximum amount of frequency shift could exceed 10,000 parts per million if the total area disposed between the interdigitated transducers was used. However, it is also believed that shifts of this order would degrade both the insertion loss and unloaded Q of the device. However, since only about 25 to 50 parts per million is generally required to account for the uncertainty in the frequency after sealing of the package, only a small fraction of the pad area is generally redeposited onto active area between the IDTs.

Four devices operating at 402 MHz were trimmed using the above described technique. A trilevel film, as shown in FIG. 4, comprising a 400 A thick layer of aluminum oxide $Al_2O_3$ corresponding to layer 26a, a 100 A thick layer of aluminum corresponding to layer 26b, and a 250 A thick layer of aluminum oxide corresponding to layer 26c were deposited on the inner portion of the cover 14. The thicknesses of the deposit layers of 12a-12c may be selected to provide different amounts of mass loading per pulse of incident energy light. Therefore, the layer 26a may have a thickness typically in the range of 200 A to 1000 A, layer 26b will have a thickness in the range of 25 A to 200 A, and layer 26c will have a thickness in the range of 50 A to 500 A.

The power level, number of pulses, and the number of redeposited lines provided to four illustrative examples of the present invention, as well as, the initial frequency, final frequency, and the frequency shift of these devices are shown in the Table, examples 1–4.

Alternatively, the incident laser beam may be directed through the base 12 towards the trim pad 26, as shown in FIG. 4B. The incident laser energy then may be used to ablate regions off of the trim pad onto the cover, for example by turning the SAW device upside down, as shown, to again change the mass loading in said region, and accordingly, the surface wave velocity characteristic of the SAW devices.

TABLE

| DEVICE I. D. | TRIM TECHNIQUE | LASER | WAVE-LENGTH μm | ENERGY DENSITY PER PULSE J/cm² | PULSE LENGTH ns | REP RATE hz | LINE WIDTH μm | # OF LINES | fo MHz | f Trim MHz | $\frac{\Delta f}{f}$ PPM |
|---|---|---|---|---|---|---|---|---|---|---|---|
| 1. | Trilevel film on cover | Excimer | 0.193 | 5 | 15 | 1 | 7 | 5 | 401.831 | 401.817 | −35 |
| 2. | Trilevel film on cover | Excimer | 0.193 | 5 | 15 | 1 | 7 | 5 | 401.840 | 401.828 | −30 |
| 3. | Trilevel film on cover | Nd:YAG | 1.06 | 0.0025 | 250 | 1024 | 50 | 5 | 402.178 | 402.166 | −30 |
| 4. | Trilevel film on cover | Nd:YAG | 1.06 | 0.00325 | 250 | 1024 | 60 | 1 | 402.219 | 402.203 | −40 |
| 5. | Removal of SAW Surface | Excimer | 0.193 | 7 | 15 | 50 | 50 | 0.1 | 402.174 | 402.170 | −10 |
| 6. | Chemical Conversion of Al-O Cermet | Excimer | 0.193 | 5 | 15 | 10 | 100 | 5 | 401.962 | 401.955 | −17 |

Figure 5:
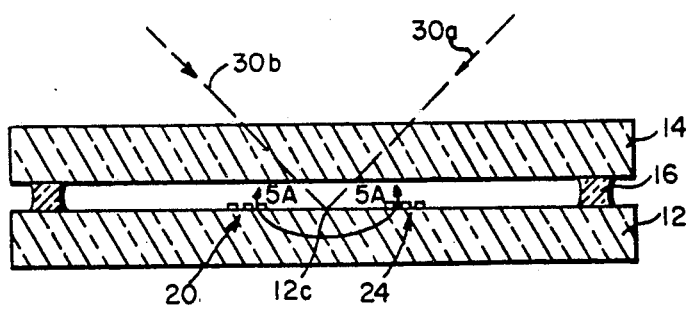
FIG. 5 is a cross-sectional view of an alternate embodiment of the present invention, using converging pairs of directed energy beams.
Figure 5A:
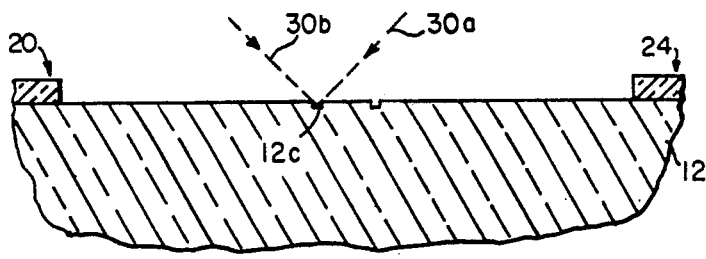
FIG. 5A is a blown up view taken along line 5A—5A of FIG. 5.

Referring now to FIG. 5, an alternate embodiment of the present invention for selectively changing the frequency characteristics of a packaged SAW device is shown. Here the packaged SAW device 10' includes the aforementioned base 12, and a cover 14 as generally described in conjunction with FIGS. 1 and 2. In accordance with this aspect of the present invention, directed energy here in the form of light energy from an excimer laser is directed through the quartz cover 14 towards the base 12. Here a pair of beams of excimer laser light are directed through the quartz cover 12 at a selected incident angle such that the beams converge on the quartz base 12 to selectively remove or ablate a portion of the quartz base 12 in a region thereof, disposed between the pair of interdigitated transducers, as shown in particular in FIG. 5A. Alternatively, three or more beams or a highly convergent beam may be used. The power density at the point where the beam or beams converge must be sufficient to remove selected amounts of material. Since the cover comprised of quartz typically 1-2 mm thick is about 85%-95% transmissive, the power density at the point of convergence must be sufficient to remove the quartz at that region. With this particular arrangement, since the acoustic properties of the surface wave propagating surface between the pair of transducers 20 and 24 is altered by the selectively removal of the material, the surface wave velocity characteristics between said pairs of transducers is also altered. Thus, the frequency of the device incorporating this arrangement is selectively altered. Again, the number, depth, and width of these regions 12c disposed within the surface wave propagating surface portion of the base 12 may be selected to provide a selected shift in the acoustic and, hence, frequency characteristics of the surface acoustic wave device. Typically, the depth of the grooves will be approximately 0.5 microns, and the width of the grooves will be in the order of the surface wave propagating wavelength (2 to 50 microns). With this particular arrangement, the intensity of beams 30a and 30b directed through the quartz cover 14 is insufficient to disrupt or disturb the material of the cover 14. However, since at the point of convergence of the two beams, the intensity of the beams are added, then the intensity of the beam is sufficient to ablate a selected portion 12c of the surface wave propagating surface 12a. Since the mass and propagation path of the surface wave propagating surface is altered by this arrangement, the surface wave propagating velocity and thus, frequency of the device will also be altered. Example 5 in the Table shows the results of a device trimmed using this technique.

Figure 6:
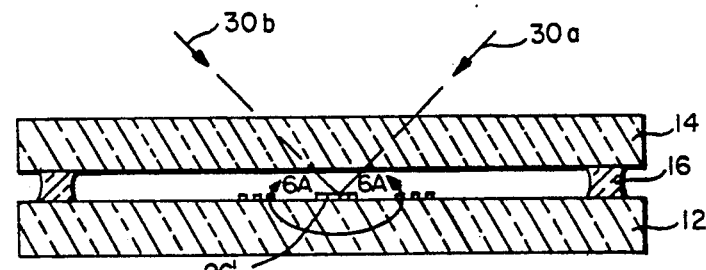
FIG. 6 is a cross-sectional view of a further embodiment of the present invention using converging pairs of directed energy beams to ablate a pad deposited on a surface wave propagating surface.
Figure 6A:
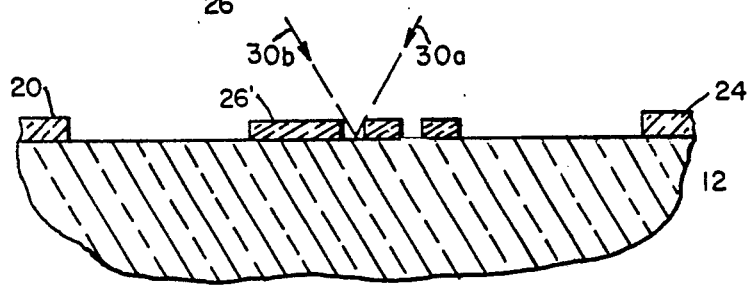
FIG. 6A is a blown up view taken along line 6A—6A of FIG. 6.

Referring now to FIG. 6, a further embodiment of the invention is shown to include a trim pad 26 disposed on the base within the acoustic aperture of the IDT's. Here a beam or preferable a pair of converging laser beams may be used to selectively irradiate a portion of the trim pad 26 to ablate a portion of the trim pad 26 providing pad 26', as shown in FIG. 6A. Alternatively the beams may be used to change; the molecular bonding of that portion of the trim pad. Again, since the mass loading in the region where the composition of the material is changed, the acoustic properties and, hence, surface velocity and frequency characteristics of the device are also changed.

Several approaches may be used to change the molecular bonding of the material of the trim pad. For example, an aluminum-oxygen cermet such as described in conjunction with a paper entitled "Submicron Patterning by Projecting Excimer-Laser-Beam Induced Chemistry" by Ehrlich et al. J. Vac. Sci. Tech. B 3 (1) Jan.-/Feb. 1985 may be used. In this case, a cermet layer is deposited as the trim pad 26. The excimer energy is directed towards the trim pad and in response Al-O bonds are broken and localized growth of $Al_2O_3$ within the trim pad occurs. Again, the spacing and number of localized area of growth of $Al_2O_3$ is selected in accordance with desired amount of change in surface wave velocity. An example of this trimming technique is shown as Example 6 in the Table.

Alternatively, layers of $Al_2O_3$, Al may be provided as the trim pad 26 and the trim pad 26 again is subjected in selective regions to excimer light and Al-Al and Al-O bonds are broken and a new phase $Al_2O_x$ would be provided where x would represent a non-stoichiometric composition.

A further technique would have a layer of Al deposited as the trim pad 26. The cavity of the package 10 is filled with a reactant gas $O_2$ or $NO_2$ for example, to a pressure typically in the range of $2 \times 10^{-6}$ torr to $1 \times 10^{-4}$ torr. Incident energy is again directed towards the trim pad 26 where Al-Al bonds are broken, causing $Al_2O_3$ to form pyrolytically. By controlling the amount of area irradiated, the selected amount of surface wave velocity change is provided.

Figure 7:
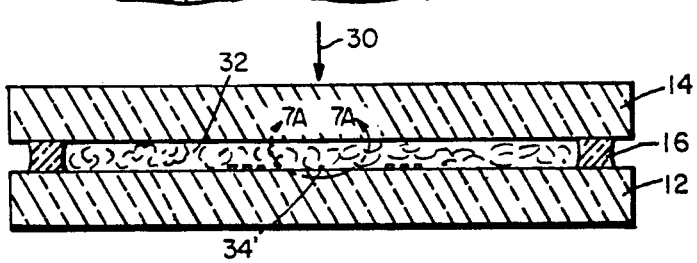
FIG. 7 is a cross-sectional view of a further embodiment having a gas mixture enclosed in the package with incident energy directed towards said mixture to provide a layer of material over the surface wave propagating surface.
Figure 7A:
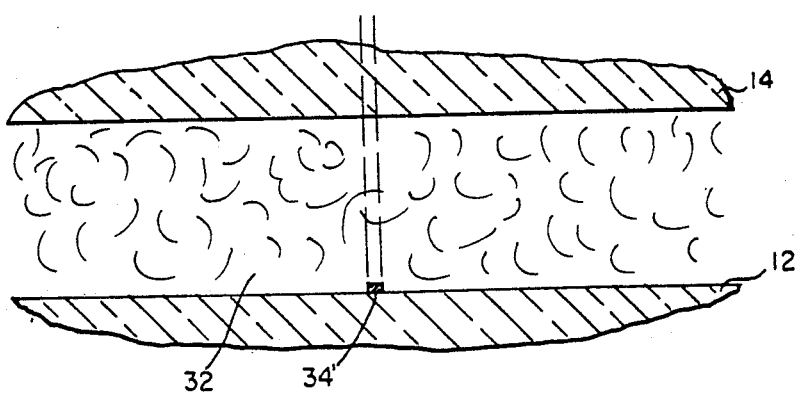
FIG. 7A is a blown up view taken along lines 7A—7A of FIG. 7.

Referring now to FIGS. 7, 7A a further embodiment of the invention is shown. Here the packaged SAW device comprised of the cover 14 and base 12 has sealed within it reactant gasses 32. A laser beam such as excimer light, Nd-YAG etc. is directed through said device to photolytically break the bonds of these reactant gasses and have deposited out from said photolytic reaction a material onto the surface wave propagation surface. Here selected patterns of excimer light would be provided to deposit selected patterns of said material onto the surface. Reactant gasses may include oxygen and a source of a suitable metal such as aluminum, silicon, etc. For example, TMAl (Trimethylaluminum), $SiH_4$ silane etc. may be used. The particular gas chosen for the metal source for example, would have to be stable during the sealing operation of the glass frit in those types of packages employing a glass-frit seal.

The excimer laser light may be directed towards these selected gasses and photolytically break the bonds of the metal source gas. This free metal would then react with the oxygen and a metal oxide layer 34' would be deposited out of the vapor over the substrate. Thus, again a localized region of $Al_2O_3$, for example, may be grown on the surface wave propagation surface.

Having described preferred embodiments in the invention, it will now become apparent to one of the skill in the art that other embodiments incorporating their concepts may be used. Further, it would now become obvious to one of the skill in the art that a beam or a pair of converging beams may be used to selectively remove a pad disposed between the pair of interdigitated transducers on the base 12 as shown in FIG. 6, or to remove and redeposit portions of a trim pad disposed on an inner portion of the cover 14, for example, by directing the beams through the base 12 or the cover 14. It is felt, therefore, that these embodiments should not be limited to disclosed embodiments, but rather should be limited only to by the spirit and scope of the appended claims.

What is claimed is:

1. A surface acoustic wave device comprising:
   a base having a surface for supporting surface wave propagation, including at least a transducer coupled to said surface wave propagation surface;
   a cover disposed over said base enclosing said surface wave propagating surface, said cover comprised of a material which is optically transparent to electromagnetic energy generally in the wavelength range of about 0.185 µm to 4 µm;
   a first layer comprised of a metal oxide and disposed between said cover and base; and
   a second layer comprised of a metal oxide and disposed on said surface wave propagation surface with a first one of said first and second layers having a recess and with a second, different one of said first and second layers disposed in alignment with said recess and having dimensions comparable to those of said recess.

2. The SAW device as recited in claim 1 wherein the first layer of material is a composite layer, and is disposed on an inner surface of said cover, and further comprises:
a first layer of a thermally buffering metal oxide material;
a second layer of a thermally absorbing material; and
a third layer of a thermally ablatable metal oxide material.

3. The device as recited in claim 2 wherein said composite layer of material is disposed over a relatively minor portion of said cover.

4. The device as recited in claim 3 wherein the second layer is disposed on a relatively minor portion of the surface wave propagating surface relative to the portion of the cover occupied by the composite first layer to provide a localized region of change in a surface wave velocity characteristic of the surface wave propagation surface.

5. The device as recited in claim 2 wherein said base and said cover are sealed together by a glass frit.

6. The device as recited in claim 4 wherein said base and said cover are sealed together by a glass frit.

7. The device as recited in claim 1 wherein the second layer of material is a composite layer, disposed on said base and further comprises:
a first layer of a thermally buffering metal oxide material;
a second layer of a thermally absorbing material; and
a third layer of a thermally ablatable metal oxide material.

8. The device of claim 7 wherein said composite second layer is disposed over a relatively minor portion of said surface wave propagation surface.

9. The device of claim 8 wherein the material of said layer comprises aluminum oxide.

10. The device of claim 8 wherein said first layer of material is disposed over a relatively minor portion of said cover relative to the portion of the surface wave propagation surface occupied by the composite second layer to provide a localized region of change in surface wave velocity characteristic on said base.

11. The device of claim 10 wherein the material of said second composite layer comprises aluminum oxide.

12. The device of claim 1 wherein the first layer of material is a reactant gas enclosed by said cover and base, and the second layer of material is a metal oxide having a predetermined composition, and further includes a portion of said reactant gas selected to provide a localized change in the composition of said metal oxide to provide a localized region of the change in surface wave velocity.

13. The device of claim 1 wherein the first layer of material comprises a pair of reactant gases enclosed by said cover and base and the second layer of material is a metal oxide and is the reaction product of said pair of reactant gases.

14. Line 2 delete "a metal" and replace with --aluminum--.

15. A surface wave device comprising:
a base having a surface for supporting surface wave propagation, including a pair of transducers, each one being coupled to said surface wave propagation surface, each transducer comprised of a plurality of interdigitated conductive members disposed on said surface wave propagation with said members having a predetermined length across said surface;
a recess disposed in a region of said propagation surface between said pair of transducers, said recess being disposed only in a minor portion of said surface, relative to the length of said conductive members across said surface, to provide a small localized change in a surface wave velocity characteristic of the surface;
a cover disposed over said base to enclose said surface wave propagation surface;
means for hermetically sealing said cover and base; and
wherein at least one of said base and cover are substantially transparent to optical energy.

16. The device of claim 15 wherein said recessed portion is a substantially narrow line.

17. The device of claim 16 wherein said narrow line is provided between a portion of said base and parallel to said pair of transducers.

18. The device of claim 15 wherein said cover comprises ST or rotated ST-cut quartz.

19. A surface acoustic wave device comprising:
a base having a surface which supports surface wave propagation including a pair of transducers coupled to said surface wave propagation surface:
a cover disposed over said base, enclosing said surface wave propagating surface, said cover comprised of a material which is optically transparent to electromagnetic energy generally in the wavelength range of about 0.185 micrometers to 4.0 micrometers;
a composite layer of material disposed on said cover comprising:
a first layer of thermally buffering material disposed on the cover;
a second layer of a thermally absorbing material disposed on the thermally buffering layer; and
a third layer of a thermally ablatable material disposed on the thermally absorbing material.

20. The device of claim 19 further comprising:
a second layer of material disposed on said surface wave propagation surface.

21. The device as recited in claim 20 wherein said second layer of material is provided from a portion to change the surface wave velocity characteristic of said surface.

22. The device as recited in claim 21 wherein said first layer of a thermally buffering material is aluminum oxide, the second layer of thermally absorbing material is aluminum, and third layer of thermally ablatable material is aluminum oxide.

23. The device as recited in claim 22 wherein the first layer has a thickness in the range of 200 A to 1,000 A, the second layer had a thickness in the range of 25 A to 200 A, and the third layer had a thickness in the range of 50 A to 500 A.

24. The device as recited in claim 23 wherein the cover comprises ST-cut quartz.

25. The device as recited in claim 24 wherein the base comprises ST-cut quartz and wherein said base and said cover are sealed together with a glass-frit seal.

26. A surface acoustic wave device comprising:
a base having a surface which supports surface wave propagation including a pair of transducers coupled to said surface wave propagation surface:
a cover disposed over said base, enclosing said surface wave propagating surface, said cover comprised of a material which is optically transparent to electromagnetic energy generally in the wavelength range of about 0.185 micrometers to 4.0 micrometers; and a layer of material comprised of aluminum and oxygen disposed on said propagating surface, with a first region of said layer having a first composition ratio of aluminum to oxygen, and a second selected region of said material having a second different composition ratio of aluminum to oxygen, to provide a selected variation to the surface wave velocity characteristic of said surface wave propagating surface.

27. The device as recited 26 wherein said first region of said composite layer is an aluminum-oxygen cermet and said second region of said composite layer is a localized area of $Al_2O_3$.

28. The device as recited 26 wherein the first region of the composite layer is aluminum oxide and the second region of the composite layer is a nonstoichiometric composition of aluminum and oxygen having the general formula: $Al_2O_x$, where x represents a nonstoichiometric composition.

29. The device as recited in claim 26 wherein the first region of the composite layer comprises aluminum and the second selected region is a localized area of aluminum oxide.

* * * * *